(12) United States Patent
Lim et al.

(10) Patent No.: US 8,552,541 B2
(45) Date of Patent: Oct. 8, 2013

(54) POWER DEVICE PACKAGES HAVING THERMAL ELECTRIC MODULES USING PELTIER EFFECT AND METHODS OF FABRICATING THE SAME

(75) Inventors: Seung-won Lim, Gyeonggi-do (KR); O-soeb Jeon, Seoul (KR); Joon-seo Son, Seoul (KR); Byoung-ok Lee, Gyeonggi-do (KR); Man-kyo Jong, Gyeonggi-do (KR)

(73) Assignee: Fairchild Korea Semiconductor, Ltd., Wonmi-District, Bucheon, Kyonggi Province (KR)

( * ) Notice: Subject to any disclaimer, the term of this patent is extended or adjusted under 35 U.S.C. 154(b) by 0 days.

(21) Appl. No.: 13/101,078

(22) Filed: May 4, 2011

(65) Prior Publication Data

US 2011/0204500 A1    Aug. 25, 2011

Related U.S. Application Data

(62) Division of application No. 12/406,757, filed on Mar. 18, 2009, now abandoned.

(30) Foreign Application Priority Data

Mar. 28, 2008    (KR) .................... 10-2008-0029311

(51) Int. Cl.
*H01L 23/495* (2006.01)
*H01L 23/48* (2006.01)
*H01L 23/52* (2006.01)
*H01L 23/34* (2006.01)
*H01L 21/00* (2006.01)

(52) U.S. Cl.
USPC ........... 257/675; 257/690; 257/712; 257/713; 257/721; 257/723; 257/E25.016; 257/E21.506; 438/122; 438/123

(58) Field of Classification Search
None
See application file for complete search history.

(56) References Cited

U.S. PATENT DOCUMENTS

| 3,524,771 | A | * | 8/1970 | Green ........................... 136/203 |
| 6,083,770 | A | * | 7/2000 | Sato et al. ...................... 438/54 |
| 2005/0146060 | A1 | * | 7/2005 | Suzuki .......................... 257/930 |
| 2006/0056213 | A1 | * | 3/2006 | Lee et al. ....................... 363/144 |
| 2006/0244118 | A1 | * | 11/2006 | Roberts et al. ................ 257/686 |
| 2009/0020148 | A1 | * | 1/2009 | Boukai et al. ................. 136/201 |

FOREIGN PATENT DOCUMENTS

JP    04329658 A    * 11/1992

OTHER PUBLICATIONS

English translation of JP 04329658 A to Horiuchi et al.*

* cited by examiner

*Primary Examiner* — N Drew Richards
*Assistant Examiner* — Michael Jung
(74) *Attorney, Agent, or Firm* — Kenneth E. Horton; Kirton McConkie

(57) ABSTRACT

Provided are power device packages, which include thermal electric modules using the Peltier effect and thus can improve operational reliability by rapidly dissipating heat generated during operation to the outside, and methods of fabricating the same. An exemplary power device package includes: a thermal electric module having a first surface and a second surface opposite each other, and a plurality of n-type impurity elements and a plurality of p-type impurity elements alternately and electrically connected to each other in series; a lead frame attached to the first surface of the thermal electric module by an adhesive member; at least one power semiconductor chip and at least one control semiconductor chip, each chip being mounted on and electrically connected to the lead frame; and a sealing member sealing the thermal electric module, the chips, and at least a portion of the lead frame, but exposing the second surface of the module.

20 Claims, 6 Drawing Sheets

POWER DEVICE PACKAGES HAVING THERMAL ELECTRIC MODULES USING PELTIER EFFECT AND METHODS OF FABRICATING THE SAME

CROSS-REFERENCES TO RELATED APPLICATIONS

This application is a Divisional of U.S. patent application Ser. No. 12/406,757 filed on Mar. 18, 2009, which claims the benefit of Korean Patent Application No. 10-2008-0029311, filed on Mar. 28, 2008, in the Korean Intellectual Property Office. Both of the above-identified applications and their contents are incorporated herein by reference in their entirety for all purposes.

BACKGROUND OF THE INVENTION

1. Field of the Invention

The present invention relates to power device packages and methods of fabricating the same, and more particularly, to power device packages, each of which includes a thermal electric module using the Peltier effect and thus can improve operational reliability by rapidly dissipating heat generated during operation to the outside, and methods of fabricating the power device packages.

2. Description of the Related Art

As the power electronic industry develops power devices, such as power transistors, insulated-gate bipolar transistors (IGBTs), MOS transistors, silicon-controlled rectifiers (SCRs), power rectifiers, servo drivers, power regulators, inverters, and converters, demands for lighter and smaller power products with improved performance are increasing. To meet these demands, research is being actively conducted on smart power modules or intelligent power modules, which can integrate not only various power semiconductor chips into a single package but also include control semiconductor chips, such as integrated circuit chips, for controlling the power semiconductor chips.

Conventional power device packages have been fabricated by mounting a plurality of semiconductor chips on a substrate. For example, U.S. Pat. No. 5,703,399 assigned to Mitsubishi discloses a power device package in which power semiconductor chips and control semiconductor chips mounted on one lead frame are molded into one package. Typically, since power device packages generate heat during operation, it is important to rapidly dissipate the heat to the outside for reliable operation. Since the generated heat is generally discharged to the outside through a substrate, when a substrate, such as a ceramic substrate, having a low heat transfer coefficient, is used, there is a limitation in improving heat transfer characteristics.

BRIEF SUMMARY OF THE INVENTION

The present invention provides power device packages that include thermal electric modules using the Peltier effect and thus can improve operational reliability by rapidly dissipating heat generated during operation to the outside.

The present invention also provides methods of fabricating power device packages that include thermal electric modules using the Peltier effect and thus can improve operational reliability by rapidly dissipating heat generated during operation to the outside.

According to an aspect of the present invention, there is provided a power device package including: a thermal electric module having a first surface and a second surface opposite each other, and a plurality of n-type impurity elements and a plurality of p-type impurity elements alternately and electrically connected to each other in series; a lead frame attached to the first surface of the thermal electric module by an adhesive member; one or more power semiconductor chips disposed on and electrically connected to the lead frame; one or more control semiconductor chips disposed on and electrically connected to the lead frame to control at least one the power semiconductor chip; and a sealing member sealing the thermal electric module, the one or more power semiconductor chips, the one or more control semiconductor chips, and at least a portion of the lead frame so as to expose the second surface of the thermal electric module.

In an embodiment of the present invention, the thermal electric module may include: an impurity element array portion having the n-type impurity elements and the p-type impurity elements alternately arranged with respect to each other; a plurality of conductive members respectively formed on and below the impurity element array portion and electrically connecting the n-type impurity elements and the p-type impurity elements in series; a power wiring electrically connected to a portion of the conductive members so as to supply DC (direct current) power to the impurity element array portion from the outside; and a plurality of insulating members respectively attached on and below the conductive members opposite to the impurity element array portion.

In an embodiment of the present invention, the impurity element array portion comprises a semiconductor substrate, the n-type impurity elements are n-type impurity regions formed by doping or ion implanting n-type impurities in the semiconductor substrate, and the p-type impurity elements are p-type impurity regions formed by doping or ion implanting p-type impurities in the semiconductor substrate.

In an embodiment of the present invention, the conductive members may include aluminum, an aluminum alloy, copper, a copper alloy, nickel, a nickel alloy or a combination thereof. The power wiring may be electrically connected to the lead frame so as to supply DC power to the impurity element array portion.

In an embodiment of the present invention, the n-type impurities included in the n-type impurity elements include one or more selected from the group consisting of N, P, As, Sb, Bi, S, Se, Te, and Po, and the p-type impurities included in the p-type impurity elements include one or more selected from the group consisting of B, Al, Ga, In, Tl, Zn, Cd, and Hg.

In an embodiment of the present invention, one or both of the power semiconductor chips and the control semiconductor chips may be mounted to be electrically connected to the lead frame in the form of flip chips or are electrically connected to the lead frame by using wires or solder balls. Each wire may include aluminum (Al) or gold (Au).

In an embodiment of the present invention, the power semiconductor chips may include power metal oxide semiconductor field effect transistors (MOSFETs), bipolar junction transistors (BJTs), insulated-gate bipolar transistors (IGBTs), diodes, or combinations thereof.

In an embodiment of the present invention, the sealing member may include an epoxy molding compound (EMC), a polyimide, a silicone, a silicone rubber, or a combination thereof.

In an embodiment of the present invention, the power device package may further include a heat sink attached to the second surface of the thermal electric module and dissipating heat. The heat sink may include aluminum, an aluminum alloy, copper, a copper alloy, $Al_2O_3$, BeO, AlN, SiN, an epoxy-based resin, or a combination thereof.

In an embodiment of the present invention, the lead frame adhesive member may include an elastomer or an epoxy.

According to another aspect of the present invention, there is provided a power device package including: a thermal electric module having a first surface and a second surface opposite each other, and a plurality of n-type impurity elements and a plurality of p-type impurity elements alternately and electrically connected to each other in series; a wiring pattern disposed on the first surface; a lead frame attached to the first surface of the thermal electric module by a conductive adhesive member and electrically connected to the wiring pattern; one or more power semiconductor chips disposed on and electrically connected to the wiring pattern; one or more control semiconductor chips disposed on and electrically connected to the lead frame, the wiring pattern, or both to control at least one power semiconductor chip; and a sealing member sealing the thermal electric module, the one or more power semiconductor chips, the one or more control semiconductor chips, and at least a portion of the lead frame so as to expose the second surface of the thermal electric module.

In an embodiment of the present invention, the wiring pattern may include aluminum, an aluminum alloy, copper, a copper alloy, or a combination thereof. The wiring pattern may further include nickel, gold, or an alloy thereof. The conductive adhesive member may include a solder, a solder paste, a silver (Ag) paste, or a combination thereof.

In an embodiment of the present invention, one or both of the power semiconductor chips and the control semiconductor chips may be mounted to be electrically connected to the wiring pattern or the lead frame in the form of flip chips or be electrically connected to the wiring pattern or the lead frame by using wires or solder balls. Each wire may include aluminum (Al) or gold (Au).

According to another aspect of the present invention, there is provided a method of fabricating a power device package, the method including: assembling a lead frame and a first surface of a thermal electric module together using an adhesive member, the thermal electric module having a second surface opposite to the first surface, a plurality of n-type impurity elements, and a plurality of p-type impurity elements, the n-type impurity elements and the p-type impurity elements being alternately and electrically connected to each other in series; mounting one or more power semiconductor chips and one or more control semiconductor chips on the lead frame; electrically connecting at least one power semiconductor chip and at least one control semiconductor chip to the lead frame; and sealing the thermal electric module, the one or more power semiconductor chips, the one or more control semiconductor chips, and a portion of the lead frame with a sealing member so as to expose the second surface of the thermal electric module.

According to another aspect of the present invention, there is provided a method of fabricating a power device package, the method including: preparing a thermal electric module having a first surface and a second surface opposite to each other, and a plurality of n-type impurity elements and a plurality of p-type impurity elements alternately and electrically connected to each other in series; attaching a lead frame onto the first surface of the thermal electric module using a lead frame adhesive member; mounting one or more power semiconductor chips and one or more control semiconductor chips on the lead frame; electrically connecting the power semiconductor chips and the control semiconductor chips respectively to the lead frame; and sealing the thermal electric module, the power semiconductor chips, the control semiconductor chips and a portion of the lead frame by using a sealing member so as to expose the second surface of the thermal electric module.

In an embodiment of the present invention, the attaching of the lead frame further may include electrically connecting the thermal electric module and the lead frame.

In an embodiment of the present invention, after the sealing of the substrate, the power semiconductor chips, and the portion of the lead frame, the method further includes: performing trimming to leave only external leads exposed to the outside of the sealing member among other leads of the lead frame; and performing forming to bend the external leads.

According to another aspect of the present invention, there is provided a method of fabricating a power device package, the method including: forming a wiring pattern on a first surface of a thermal electric module, the thermal electric module having a second surface opposite to the first surface, a plurality of n-type impurity elements, and a plurality of p-type impurity elements, the n-type impurity elements and the p-type impurity elements being alternately and electrically connected to each other in series; mounting one or more power semiconductor chips on the thermal electric module so as to electrically connect to the wiring pattern; assembling a lead frame and the first surface of the thermal electric module together using a conductive adhesive member so that the lead frame and the wiring pattern are electrically connected; and sealing the thermal electric module, the power semiconductor chips, the control semiconductor chips and a portion of the lead frame with a sealing member so as to expose the second surface of the thermal electric module.

According to another aspect of the present invention, there is provided a method of fabricating a power device package, the method including: preparing a thermal electric module having a first surface on which a wiring pattern is formed and a second surface opposite to the first surface, and a plurality of n-type impurity elements and a plurality of p-type impurity elements alternately and electrically connected to each other in series; attaching a lead frame to the first surface of the thermal electric module using a lead frame adhesive member; mounting one or more power semiconductor chips and one or more control semiconductor chips on the lead frame; electrically connecting at least one power semiconductor chip and at least one control semiconductor chip respectively to the lead frame; and sealing the thermal electric module, one or more the power semiconductor chips, the one or more control semiconductor chips and a portion of the lead frame by using a sealing member so as to expose the second surface of the thermal electric module.

In an embodiment of the present invention, the mounting the power semiconductor chips on the wiring pattern to be electrically connected further includes mounting one or more control semiconductor chips on the wiring pattern so as to be electrically connected to the wiring pattern.

In an embodiment of the present invention, the action of attaching the lead frame further includes electrically connecting the thermal electric module and the lead frame.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
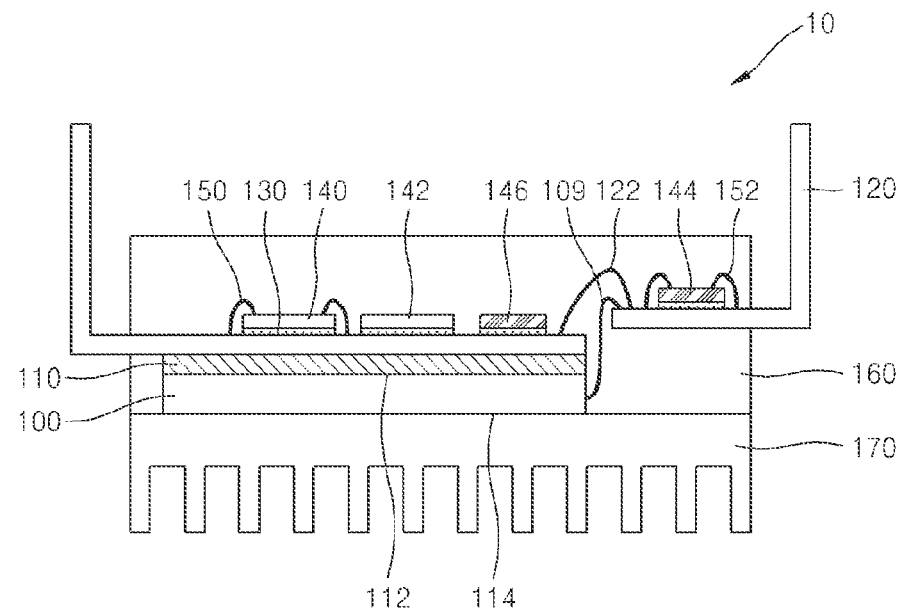
FIG. 1 is a schematic cross-sectional view of a power device package according to an embodiment of the present invention.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element, such as a layer, a region, or a substrate, is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may not be intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a power device package 10 according to an embodiment of the present invention.

Referring to FIG. 1, the power device package 10 includes a thermal electric module 100 and a lead frame 120, one or more power semiconductor chips 140 and 142, one or more control semiconductor chips 144 and 146, and a sealing member 160. The thermal electric module 100 includes a first surface 112 and a second surface 114 opposite each other, and a plurality of n-type impurity elements 101 (shown in FIG. 2) and a plurality of p-type impurity elements 102 (shown in FIG. 2) alternately and electrically connected to each other in series. Components and an operational principle of the thermal electric module 100 will now be described in detail. The lead frame 120 is attached to the first surface 112 of the thermal electric module 100 by using a lead frame adhesive member 110. The one or more power semiconductor chips 140 and 142 are mounted (i.e., disposed) on the lead frame 120 and are electrically connected to one another. The one or more control semiconductor chips 144 and 146 are mounted (i.e., disposed) on the lead frame 120 and are electrically connected to one another to control one or more of the power semiconductor chips 140 and 142. The sealing member 160 seals the thermal electric module 100, the power semiconductor chips 140 and 142, the control semiconductor chips 144 and 146, and at least a portion of the lead frame 120 so as to expose the second surface 114 of the thermal electric module 100. The power device package 10 may further include a heat sink 170 attached to the second surface 114 of the thermal electric module 100; heat sink 170 is used to dissipate heat.

Figure 2:
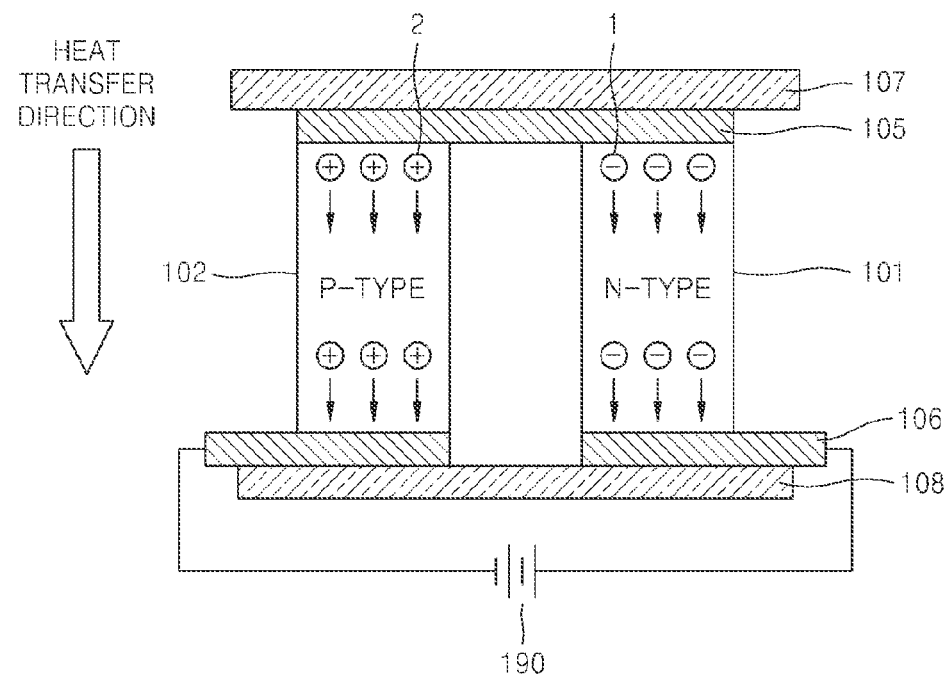
FIG. 2 is a view for describing an operational principle of a thermal electric module included in the power device package of FIG. 1.

FIG. 2 is a view for describing an operational principle of a thermal electric module included in the power device package of FIG. 1.

Referring to FIG. 2, the thermal electric module 100 includes the n-type impurity element 101 and the p-type impurity element 102 which are electrically connected to each other. In detail, an upper portion of the n-type impurity element 101 and an upper portion of the p-type impurity element 102 are electrically connected to each other by an upper conductive member 105. A lower portion of the n-type impurity element 101 and a lower portion of the p-type impurity element 102 are spaced apart from each other and connected to an external power source 190 through a lower conductive member 106. Insulating members 107 and 108, such as ceramic materials, are respectively attached on and below the upper conductive member 105 and the lower conductive member 106, which are opposite each other.

The n-type impurity element 101 includes a medium, such as silicon or silicon-germanium, with n-type impurities. The n-type impurities include one or more selected from the group consisting of nitrogen (N), phosphorus (P), arsenic (As), antimony (Sb), bismuth (Bi), sulphur (S), selenium (Se), tellurium (Te), and polonium (Po). The p-type impurity element 102 includes a medium, such as silicon or silicon-germanium, with p-type impurities. The p-type impurities include one or more selected from the group consisting of boron (B), aluminum (Al), gallium (Ga), indium (In), thallium (Tl), zinc (Zn), cadmium (Cd), and hydrargyrum (Hg).

When direct current (DC) electrical power is applied to the n-type impurity element 101 and the p-type impurity element 102 by the external power source 190, electrons move in a direction opposite to the current flow direction, and holes move in a same direction as the current flow direction. Accordingly, the main carriers in the n-type impurity element 101 are the electrons 1 which move in a downward direction opposite to the current flow direction, that is, from a region adjacent to the upper conductive member 105 to a region adjacent to the lower conductive member 106. On the other hand, the main carriers in the p-type impurity element 102 are the holes 2 which move in a same downward direction as the current flow direction, that is, from a region adjacent to the upper conductive member 105 to a region adjacent to the lower conductive member 106. Consequently, both the electrons 1 and the holes 2 flow in the same direction. The electrons 1 and the holes 2 moved by the DC current become carriers for transferring heat through the external power source 190, and the heat transfer direction is illustrated with arrows in FIG. 2. As such, when current is applied across different types of solid matter or semiconductors, heating or heat absorption different from Joule heat is generated, and this is called the Peltier effect. Typically, the Peltier effect denotes movement of heat generated due to current flow when different materials, such as metals or semiconductors, are joined to each other to become a junction. Accordingly, in FIG. 2, the n-type impurity element 101 is joined to the upper conductive member 105 and the lower conductive member 106 to become a junction, and separately, the p-type impurity element 102 is also joined to the upper conductive member 105 and the lower conductive member 106 to become another junction. Consequently, the upper conductive member 105 and the lower conductive member 106 respectively become a low-temperature portion and a high-temperature portion by the heat transfer as described above.

The power semiconductor chips 140 and 142 and/or the control semiconductor chips 144 and 146 are mounted on the upper conductive member 105 as illustrated in FIG. 1. The heat, generated due to operation of the power semiconductor chips 140 and 142 and/or the control semiconductor chips 144 and 146, moves toward the lower conductive member 106 via the n-type impurity element 101 or the p-type impurity element 102 according to the aforementioned principle, and then is dissipated to the outside.

Figure 3A:
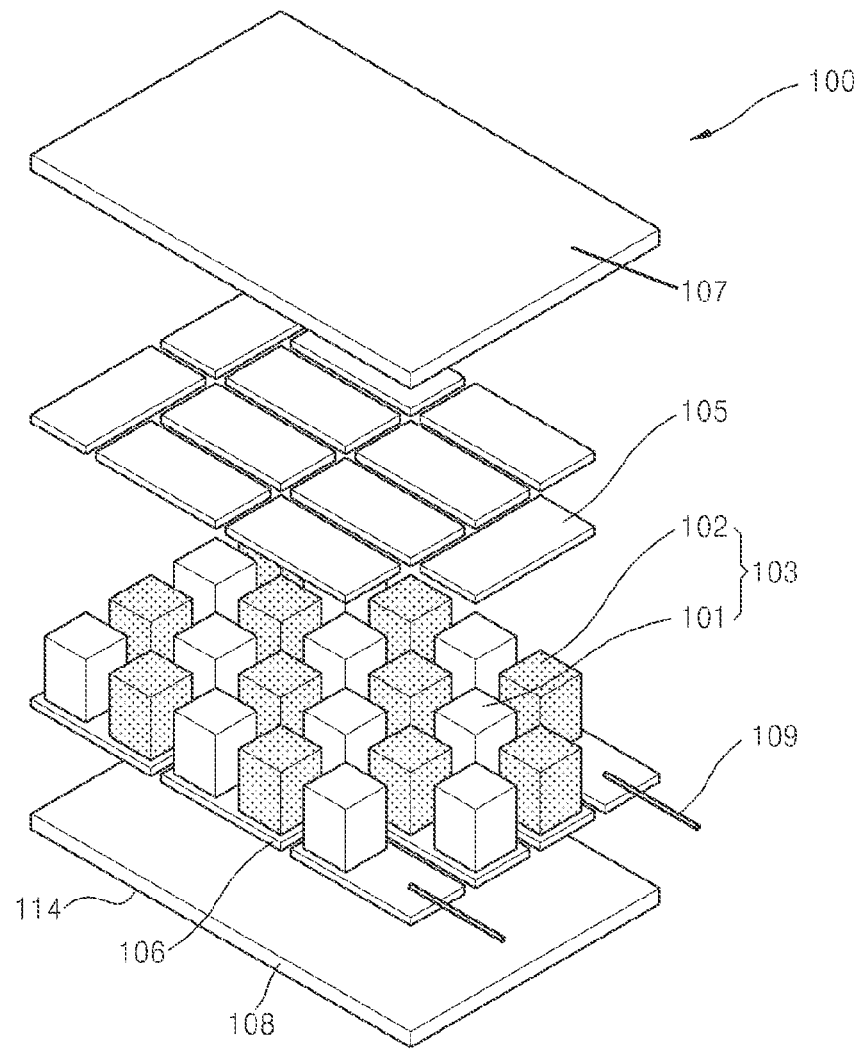
FIG. 3A is a schematic perspective view of an example of the thermal electric module included in the power device package of FIG. 1.

FIG. 3A is a schematic perspective view of an example of the thermal electric module 100 included in the power device package of FIG. 1.

Referring to FIG. 3A, the thermal electric module 100 includes an impurity element array unit 103, the upper and lower conductive members 105 and 106, a power wiring 109, and the insulating members 107 and 108. The impurity element array unit 103 includes the n-type impurity elements 101 and the p-type impurity elements 102 alternately arranged as described above with reference to FIG. 2. The upper and lower conductive members 105 and 106 are respectively formed (i.e., disposed) on and below the impurity element array unit 103, as shown in FIG. 3A. The conductive members 105 and 106 electrically connect the n-type impurity elements 101 and the p-type impurity elements 102 in series. The upper and lower conductive members 105 and 106 may include aluminum, an aluminum alloy, copper, a copper alloy, nickel, or a nickel alloy, or a combination thereof. The power wiring 109 is connected to a portion of the conductive members 105 and 106 so as to apply DC current to the impurity element array unit 103. To apply the DC current, the power wiring 109 may be electrically connected to the lead frame 120 (see FIG. 1) or to a separate external circuit. The insulating members 107 and 108 are respectively attached to the upper and lower conductive members 105 and 106, which face each other across the impurity element array unit 103. According to the above structure, the DC current applied through the power wiring 109 from the outside alternately passes through the n-type impurity elements 101 and the p-type impurity elements 102. Thus, heat is transferred from the upper conductive members 105 to the lower conductive members 106 by the Peltier effect described above with reference to FIG. 2, and consequently, the heat is dissipated to the outside.

Figure 3B:
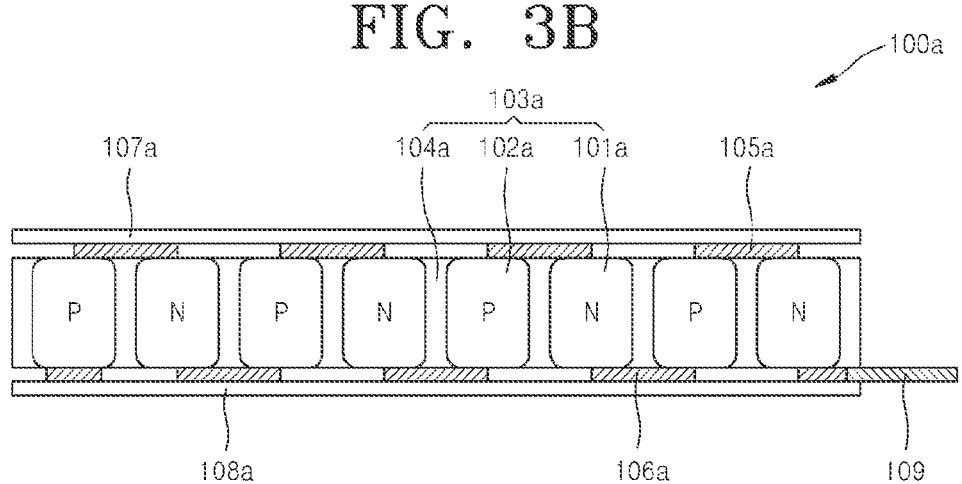
FIG. 3B is a schematic cross-sectional view of another example of the thermal electric module included in the power device package of FIG. 1.

FIG. 3B is a schematic cross-sectional view of another example of the thermal electric module 100a included in the power device package of FIG. 1. For convenience and accuracy, repeated explanations of overlapped features will not be given.

Referring to FIG. 3B, the thermal electric module 100a includes an impurity element array unit 103a, conductive members 105a and 106a, a power wiring 109, and insulating members 107a and 108a. The thermal electric module 100a according to the current embodiment has the following main features. The impurity element array unit 103a comprises a semiconductor substrate 104a, such as a silicon substrate or a silicon-germanium substrate, a plurality of n-type impurity elements 101a disposed in substrate 104a, and a plurality of p-type impurity elements 102a disposed in substrate 104a. The plurality of n-type impurity elements 101a may comprise n-type impurity regions formed by doping or ion implanting n-type impurities in the semiconductor substrate 104a, and the plurality of p-type impurity elements 102a may comprise p-type impurity regions formed by doping or ion implanting p-type impurities in the semiconductor substrate 104a. The conductive members 105a and 106a may comprise conductive patterns formed on the n-type impurity elements 101a and the p-type impurity elements 102a, respectively. The insulating members 107a and 108a may comprise an oxide, a nitride, or the like, and may be formed by a layer forming method used in a conventional semiconductor manufacturing method. However, this is exemplary and the present invention is not limited thereto. The arrangement of the n-type impurity elements 101a and the p-type impurity elements 102a and an electrical connection between the n-type impurity elements 101a and the p-type impurity elements 102a via the conductive members 105a and 106a have been described with reference to FIG. 3A. That is, the n-type impurity elements 101a and the p-type impurity elements 102a are electrically connected to each other in series by the conductive members 105a and 106a, and DC current is applied to the n-type and p-type impurity elements 101a and 102a from an external power source by the power wiring 109a, and thus heat transfer is realized by the Peltier effect as described above.

FIGS. 4A through 4F are schematic cross-sectional views illustrating a method of fabricating the power device package 10 of FIG. 1 according to an embodiment of the present invention.

Figure 4A:
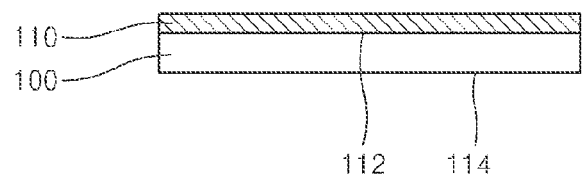
FIGS. 4A through 4F are schematic cross-sectional views illustrating a method of fabricating the power device package of FIG. 1 according to an embodiment of the present invention.

Referring to FIG. 4A, a thermal electric module 100 having a first surface 112 and a second surface 114 opposite each other is prepared. The thermal electric module 100 includes a plurality of n-type impurity elements and a plurality of p-type impurity elements alternately and electrically connected to each other in series, and the operational principle thereof has been described above with reference to FIG. 2 and its components are the same as those of embodiments described with reference to FIG. 3A or FIG. 3B. However, the materials are exemplary and the present invention is not limited thereto. A lead frame adhesive member 110 is formed on the first surface 112 of the thermal electric module 100 and may include an elastomer or an epoxy. The elastomer denotes a polymer having good elasticity, and thus the elastomer stretches when an external force is applied to the elastomer and returns to its original state when the external force is removed from the elastomer. The elastomer is called an elastic polymer. An elastic rubber, such as butadiene or styrene, or an elastic fiber, such as spandex, may be representative of an elastic polymer. The lead frame adhesive member 110 may be conductive or non-conductive. For example, the lead frame adhesive member 110 may be formed by plating, or may comprise a conductive paste or a conductive tape. Also, the lead frame adhesive member 110 may comprise a solder, a metal epoxy, a metal paste, a resin-based epoxy, or an adhesive tape with high heat resistance. For example, the adhesive tape may comprise a well-known high temperature-resistant tape such as a common glass tape, a silicone tape, a Teflon tape, a stainless foil tape, or a ceramic tape. Alternatively, the lead frame adhesive member 110 may be formed by combining the aforementioned materials. However, the forming of the lead frame adhesive member 110 and the materials thereof are exemplary and the present invention is not limited thereto.

Figure 4B:
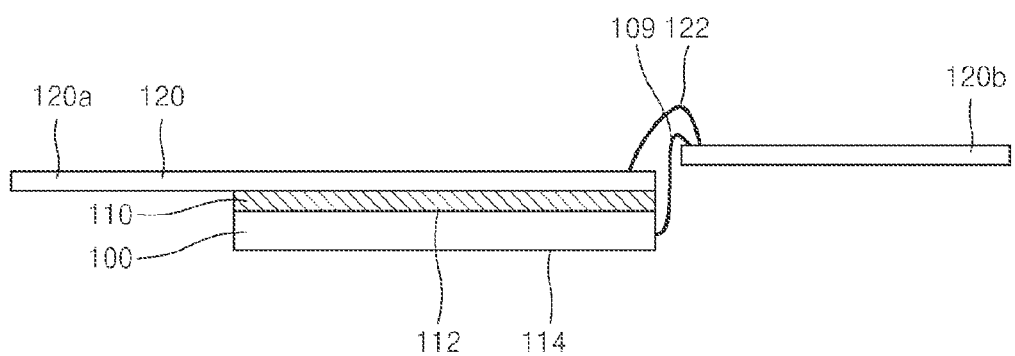

Referring to FIG. 4B, a lead frame 120 is attached to the lead frame adhesive member 110 formed on the first surface 112 of the thermal electric module 100 (that is, in general, the lead frame and the thermal electric module are assembled together). In a later process, the power semiconductor chips 140 and 142 are mounted on an end portion 120a of the lead frame 120, which is directly attached to the lead frame adhesive member 110. On the other hand, in a later process, the control semiconductor chips 144 are mounted on another end portion 120b of the lead frame 120, which is not directly attached to the lead frame adhesive member 110. The end portion 120a of the lead frame 120 and the end portion 120b of the lead frame 120 are electrically connected to each other by a lead frame wiring 122. Alternatively, the lead frame 120 may be integrally formed with the end portion 120a and the end portion 120b, or may be separately formed to respectively include the end portion 120a and the end portion 120b.

Next, the thermal electric module 100 and the lead frame 120 are electrically connected to each other. That is, the power wiring 109 illustrated in FIG. 3A or FIG. 3B is electrically connected to the lead frame 120, so that electric power can be supplied to the thermal electric module 100. In FIG. 4B, the power wiring 109 is connected to the other end portion 120b of the lead frame 120; however, this is exemplary, and the power wiring 109 may be connected to the end portion 120a of the lead frame 120. The electrical connection between the lead frame 120 and the power wiring 109 may be realized by using a conventional method, such as a soldering method. Although not shown in the drawing, the power wiring 109 may be connected to an external circuit without being connected to the lead frame 120, so that power can be supplied to the thermal electric module 100.

Figure 4C:
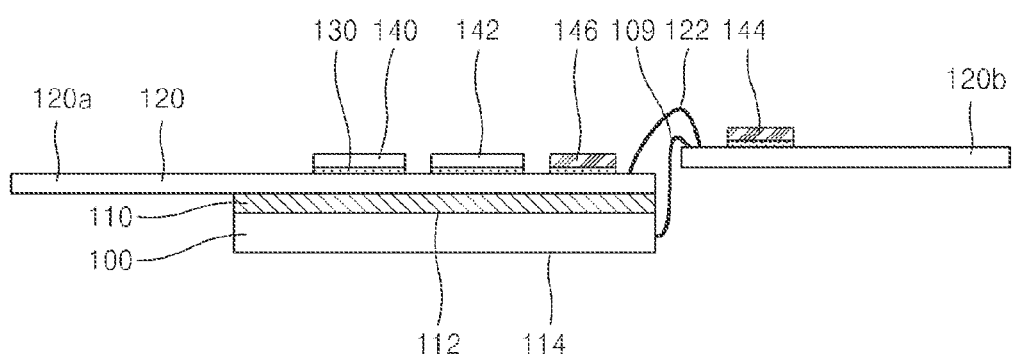

Referring to FIG. 4C, one or more power semiconductor chips 140 and 142 are mounted on the lead frame 120. The power semiconductor chips 140 and 142 may be attached to the lead frame 120 by using a chip adhesive member 130. The chip adhesive member 130 may comprise the same material as the aforementioned lead frame adhesive member 110. The power semiconductor chips 140 and 142 may comprise power circuit chips for power conversion or power control such as servo drivers, inverters, power regulators, or converters. For example, the power semiconductor chips 140 and 142 may include power metal oxide semiconductor field effect transistors (MOSFETs), bipolar junction transistors (BJTs), insulated-gate bipolar transistors (IGBTs), diodes, or combinations thereof. In other words, the power semiconductor chips 140 and 142 may include any or all of the listed items. For example, two power semiconductor chips 140 and 142 shown in FIG. 4C may comprise an IGBT and a diode, respectively. As such, the power device package 10 may include six power semiconductor chip pairs, each such pair including one IGBT and one diode. However, this is exemplary and the present invention is not limited thereto.

One or more control semiconductor chips 144 and 146 (which will be electrically connected so as to control the power semiconductor chips 140 and 142) are mounted on the lead frame 120. The control semiconductor chips 144 and 146 may be generally mounted on the end portion 120b of the lead frame 120, and also may be mounted on the end portion 120a of the lead frame 120. The control semiconductor chips 144 and 146 may comprise microprocessors, passive devices, such as resistors, inverters, or condensers, and/or active devices, such as transistors, etc. One power device package 10 may include a few to tens of control semiconductor chips 144 and 146. It may be appreciated that the type and number of the control semiconductor chips 144 and 146 can be determined according to the type and number of the power semiconductor chips 140 and 142.

Figure 4D:
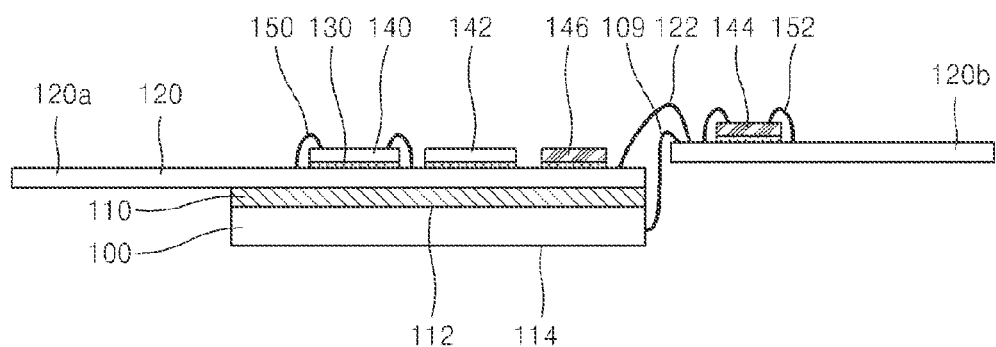

Referring to FIG. 4D, the power semiconductor chips 140 and 142 and the lead frame 120 are electrically connected to each other. The power semiconductor chips 140 and 142 may be electrically connected to the lead frame 120 in the form of flip chips, or may be electrically connected to the lead frame 120 by using wires or solder balls. In FIG. 4D, the power semiconductor chip 140 is electrically connected to the lead frame 120 by using one or more wires 150, and the power semiconductor chip 142 is electrically connected to the lead frame 120 in the form of flip chips or by using a solder ball (not shown). However, this is exemplary and the present invention is not limited thereto. Each wire 150 may include a metal such as aluminum (Al), an aluminum alloy, gold (Au), or a gold alloy. Each wire 150 may be connected to the power semiconductor chips 140 and to the lead frame 120 by ball bonding, wedge bonding, or stitch bonding, all of which are well known in the art. For this electrical connection, each of the power semiconductor chips 140 and 142 and the lead frame 120 may include a connection portion such as a typical connection pad. It may be appreciated that only one or both types of the power semiconductor chip 140 (which is electrically connected to the lead frame 120 by using the wire 150) and the power semiconductor chip 142 (which is electrically connected to the lead frame 120 in the form of flip chips or by using the solder ball) may be mounted in the power device package 10.

Similarly, the control semiconductor chips 144 and 146 and the lead frame 120 are electrically connected to each other. The control semiconductor chips 144 and 146 may be electrically connected to the lead frame 120 in the form of flip chips, or may be electrically connected to the lead frame 120 by using wires or solder balls. In FIG. 4D, the control semiconductor chips 144 are electrically connected to the lead frame 120 by using wires 150, and the control semiconductor chips 146 are electrically connected to the lead frame 120 in the form of flip chips or by using a solder ball (not shown). However, this is exemplary and the present invention is not limited thereto. The wire 152 may include a metal such as aluminum (Al), an aluminum alloy, gold (Au), or a gold alloy. Each wire 152 may be connected to the control semiconductor chip 144 and to the lead frame 120 by ball bonding, wedge bonding, or stitch bonding, all of which are well known in the art. For this electrical connection, each of the control semiconductor chips 144 and 146 and the lead frame 120 may include a connection portion such as a typical connection pad. It may be appreciated that only one or both types of the control semiconductor chip 144 (which is electrically connected to the lead frame 120 by using the wire 152) and the control semiconductor chip 146 (which is electrically connected to the lead frame 120 in the form of a flip chip or by using solder balls) may be mounted in the power device package 10. Accordingly, the control semiconductor chips 144 and 146 are electrically connected to the power semiconductor chips 140 and 142 through the lead frame 120, so that the control semiconductor chips 144 and 146 can control the operations of the power semiconductor chips 140 and 142.

In addition to the method described above with reference to FIGS. 4B through 4D, a method of attaching the lead frame 120 to the thermal electric module 100 after mounting the power semiconductor chips 140 and 142 and/or the control semiconductor chips 144 and 146 on the lead frame 120 is included in the scope of the present invention.

Figure 4E:
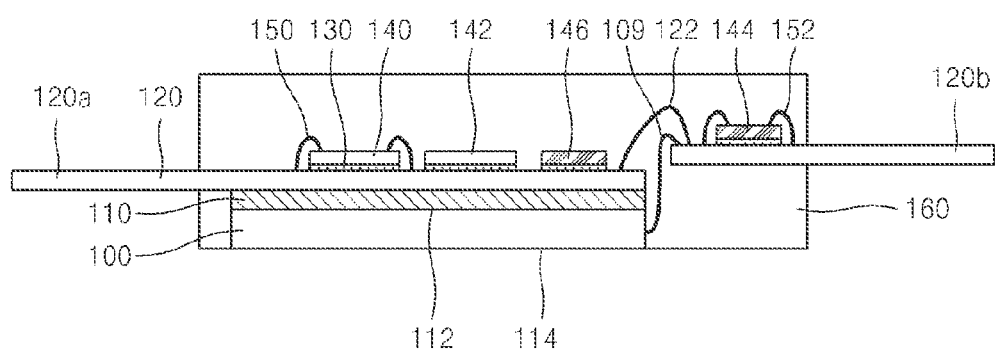

Referring to FIG. 4E, the power device package 10 is encapsulated by using a sealing member 160 by performing a typical transfer molding process or a curing process. The sealing member 160 may seal the thermal electric module 100, the power semiconductor chips 140 and 142, and the control semiconductor chips 144 and 146, and may expose the second surface 114 of the thermal electric module 100. Also, the sealing member 160 seals a portion of the lead frame 120, and external leads 120c and 120d of the lead frame 120 which are exposed to the outside are electrically connected to the outside of the power device package 10. The sealing member 160 may include an insulating resin, for example, an epoxy molding compound (EMC), a polyimide, a silicone, or a silicone rubber, or a combination thereof. It may be appreciated that the power device package 10 may have various shapes depending on the shape of an external mold (not shown) in which the sealing member 160 is made.

Figure 4F:
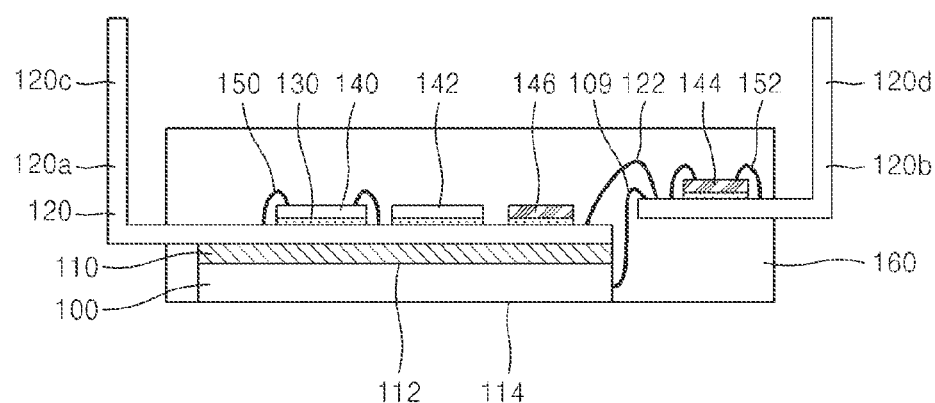

Referring to FIG. 4F, trimming of the leads of lead frame 120 is performed so that only the external leads 120c and 120d are left exposed to the outside of the sealing member 160, and bending of the external leads 120c and 120d is performed, thereby completing the power device package 10. As a result of the trimming, the trimmed leads of lead frame 120 are encased by sealing member 160 and do not extend out from the package.

Referring to FIG. 1 again, the power device package 10 may further include a heat sink 170 attached to the exposed second surface 114 of the thermal electric module 100; the heat sink 170 is used to dissipate heat. The heat sink 170 may include a metal, a metal nitride, a ceramic, a resin, or a combination thereof. For example, the heat sink 170 may include aluminum, an aluminum alloy, copper, a copper alloy, an aluminum oxide ($Al_2O_3$), a beryllium oxide (BeO), an aluminum nitride (AlN), a silicon nitride (SiN), an epoxy-based resin, or a combination thereof. The heat sink 170 may have various dimensions and shapes in order to more effectively dissipate heat. The heat sink 170 may be attached to the thermal electric module 100 by using a solder, a metal epoxy, a metal paste, a resin-based epoxy, or an adhesive tape with high heat resistance. The adhesive tape may comprise a well-known high temperature-resistant tape such as a glass tape, a silicone tape, a Teflon tape, a stainless foil tape, or a ceramic tape, or a tape including an aluminum oxide, an aluminum nitride, a silicon oxide, or a beryllium oxide. The solder may include a metal such as lead (Pb), lead/tin (Pb/Sn), tin/silver (Sn/Ag), or lead/tin/silver (Pb/Sn/Ag).

Figure 5:
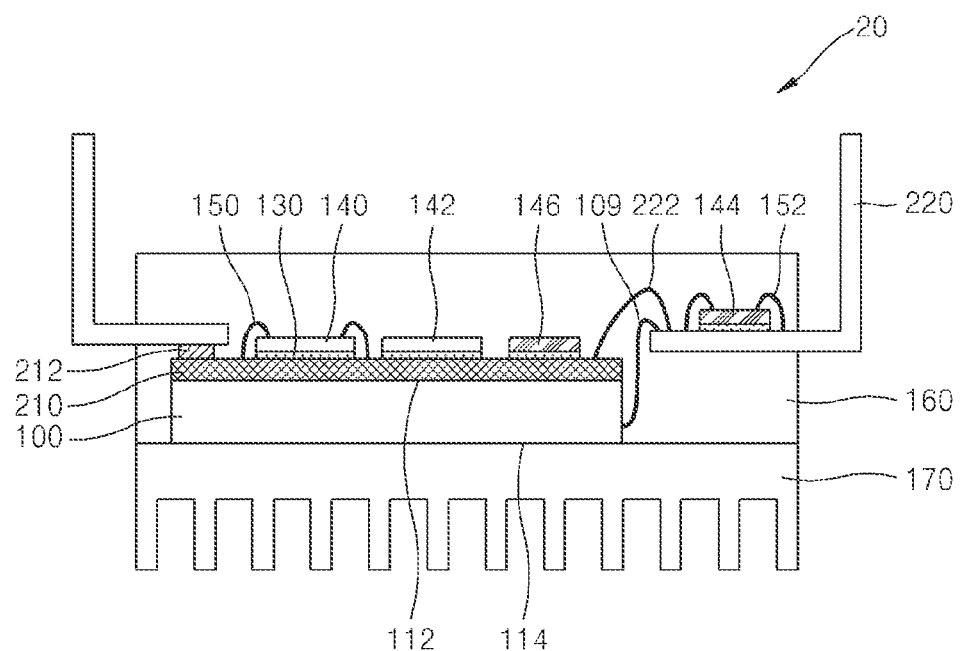
FIG. 5 is a schematic cross-sectional view of a power device package according to another embodiment of the present invention.

FIG. 5 is a schematic cross-sectional view of a power device package 20 according to another embodiment of the present invention. For convenience and accuracy, repeated explanations of overlapped features will not be given.

Referring to FIG. 5, the power device package 20 includes a thermal electric module 100, and lead frames 220, one or more power semiconductor chips 140 and 142, one or more control semiconductor chips 144 and 146, and a sealing member 160. The power device package 10 may further include a heat sink 170 attached to the second surface 114 of the thermal electric module 100; the heat sink 170 is used to dissipate heat. The main features of the power device package 20 according to the current embodiment are as follows. A wiring pattern 210 is formed on a first surface of the thermal electric module 100, and the power semiconductor chips 140 and 142 and/or the control semiconductor chips 144 and 146 are mounted on the wiring pattern 210.

FIGS. 6A through 6D are schematic cross-sectional views illustrating a method of fabricating the power device package 20 of FIG. 5 according to another embodiment of the present invention.

Figure 6A:
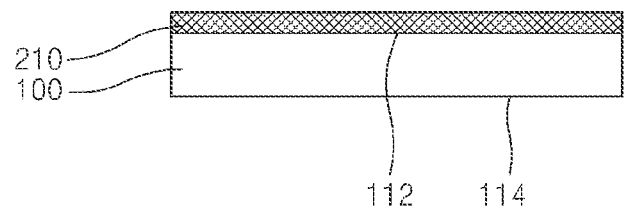
FIGS. 6A through 6D are schematic cross-sectional views illustrating a method of fabricating the power device package of FIG. 5 according to another embodiment of the present invention.

Referring to FIG. 6A, a thermal electric module 100 having a first surface 112 and a second surface 114 opposite each other is prepared or otherwise obtained. The thermal electric module 100 includes a plurality of n-type impurity elements and a plurality of p-type impurity elements which are alternately and electrically connected to each other in series. An operational principle of the thermal electric module 100 has been described above with reference to FIG. 2 and components of the thermal electric module 100 are the same as those of embodiments described with reference to FIG. 3A or FIG. 3B. However, the materials are exemplary and the present invention is not limited thereto.

Next, a wiring pattern 210 is formed on the first surface 112 of the thermal electric module 100. The first surface 112 of the thermal electric module 100 may comprise a surface of the insulating members 107 and 107a described above with reference to FIGS. 3A and 3B. The wiring pattern 210 may be formed by a typical film deposition method, such as chemical vapor deposition (CVD) or physical vapor deposition (PVD), or a plating method, such as electroplating or electroless plating. The wiring pattern 210 may include a conductive material such as a metal. For example, the wiring pattern 210 may include aluminum, an aluminum alloy, copper, or a copper alloy, or a combination thereof. The wiring pattern 210 may further include nickel, gold, or an alloy thereof. In other words, when the wiring pattern 210 is formed of a material with poor oxidation resistance, such as copper or a copper alloy, the wiring pattern 210 may be coated with a layer including nickel, gold, or an alloy thereof to prevent oxidation of the copper or copper alloy. However, the materials of the wiring pattern 210 are exemplary and the present invention is not limited thereto.

Figure 6B:
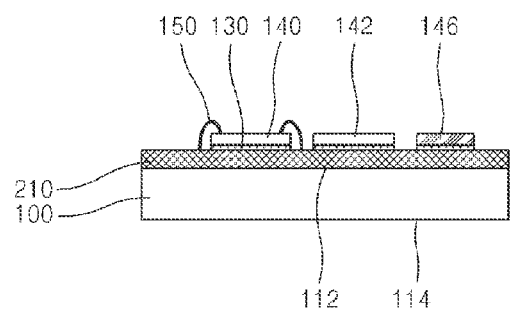

Referring to FIG. 6B, one or more power semiconductor chips 140 and 142 are mounted on the wiring pattern 210. The power semiconductor chips 140 and 142 may be attached to the wiring pattern 210 by using a chip adhesive member 130. Also, one or more control semiconductor chips 146 may be mounted on the wiring pattern 210, and may be electrically connected so as to control one or more of the power semiconductor chips 140 and 142. The type and number of the power semiconductor chips 140 and 142 and the control semiconductor chips 146 are described above. The power semiconductor chips 140 and 142 and/or the control semiconductor chip 146 are electrically connected to the wiring pattern 210. As described above, the power semiconductor chips 140 and 142 and/or the control semiconductor chips 146 may be electrically connected to the wiring pattern 210 in the form of flip chips, or may be electrically connected to the wiring pattern 210 by using wires 150 or solder balls. Wire 150 may include a metal such as aluminum (Al), an aluminum alloy, gold (Au), or a gold alloy.

Figure 6C:
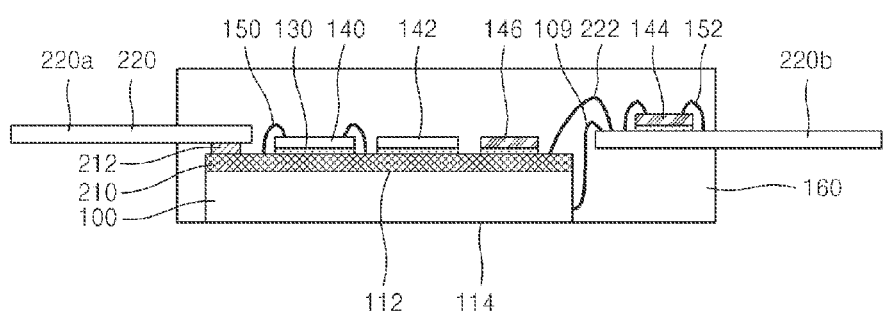

Referring to FIG. 6C, a lead frame 220 is attached to the wiring pattern 210 of the thermal electric module 100 by using a conductive adhesive member 212 (that is, in general, the lead frame and the thermal electric module are assembled together). The conductive adhesive member 212 may include a solder, a solder paste, or an Ag paste, or a combination thereof. In FIG. 6C, an end portion 220a of the lead frame 220 is electrically connected to the wiring pattern 210 by using the conductive connecting member 212, the control semiconductor chip 144 is mounted on another end portion 220b of the lead frame 220, and the end portion 220b of the lead frame 220 is electrically connected to the wiring pattern 210 by using a lead frame wiring 222. As described above, the control semiconductor chips 144 may be electrically connected to the lead frame 220 in the form of flip chips, or may be electrically connected to the lead frame 220 by using wires 152 or solder balls. Wire 152 may include a metal such as aluminum (Al), an aluminum alloy, gold (Au), or a gold alloy. However, the lead frame 220 is exemplary and the present invention is not limited thereto. Alternatively, the lead frame 120 may be integrally formed with the end portion 220a and the end portion 220b, or may be separately formed to respectively include the end portion 220a and the end portion 220b from each other.

Next, the thermal electric module 100 and the lead frame 220 are electrically connected to each other. That is, the power wiring 109 shown in FIG. 3A or FIG. 3B is electrically connected to the lead frame 220, so that power can be supplied to the thermal electric module 100 through the lead frame 220. In FIG. 4B, the power wiring 109 is connected to power wiring 109 of the lead frame 220. However, this is exemplary, and alternatively, the power wiring 109 may be connected to the end portion 220a of the lead frame 220. An electrical connection between the lead frame 220 and the power wiring 109 can be realized using a conventional method such as a soldering method. Although not shown in the drawing, the power wiring 109 may be connected to an external circuit without being connected to the lead frame 220, so that power can be supplied to the thermal electric module 100.

Figure 6D:
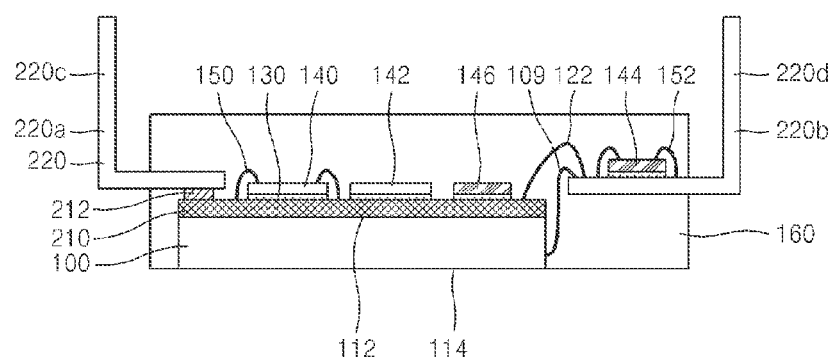

Referring to FIG. 6D, the power device package 10 is encapsulated by using a sealing member 160 by performing a typical transfer molding process or a curing process. The type of the sealing member 160 and the sealing process using the sealing member 160 are described above with reference to FIG. 4E. Also, trimming of the lead frame's leads is performed so that only the external leads 220c and 220d are left exposed to the outside of the sealing member 160 (while other leads are trimmed), and bending of the external leads 220c and 220d is performed, thereby completing the power device package 20.

Referring back to FIG. 5, the power device package 10 may further include a heat sink 170 attached to the exposed second surface 114 of the thermal electric module 100; the heat sink 170 is used to dissipate heat. The heat sink 170 has been described above with reference to FIG. 1.

Power device packages according to the present invention use thermal electric modules realizing the Peltier effect, which can transfer heat by applying current, instead of using ceramic substrates with poor thermal conductivity, so that heat generated from power semiconductor chips is rapidly dissipated to the outside, thereby increasing operation reliability of the devices.

Moreover, since a power device package according to the present invention puts the power semiconductor chips and the control semiconductor chips for controlling and driving the power semiconductor chips into one package, smart power modules or intelligent power modules can be realized.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A power device package, comprising:
   a thermal electric module having a first surface and a second surface opposite the first surface, and a plurality of n-type impurity elements and a plurality of p-type impurity elements connected in series;
   a wiring pattern disposed on the first surface;
   a first portion of a lead frame attached to the first surface of the thermal electric module by a conductive adhesive member and electrically connected to the wiring pattern;
   one or more power semiconductor chips disposed on and electrically connected to the wiring pattern;
   one or more control semiconductor chips disposed on and electrically connected to a second portion of the lead frame or the wiring pattern, or both, to control the at least one power semiconductor chip, wherein the first and second portions of the lead frame are electrically connected using wiring;

power wiring connecting the second portion of the lead frame and the thermal electric module;

a sealing member sealing the thermal electric module, the one or more power semiconductor chips, the one or more control semiconductor chips, and at least a portion of the lead frame so as to expose the second surface of the thermal electric module; and a heat sink adjacent the thermal electric module.

2. The power device package of claim 1, wherein the thermal electric module comprises:

an impurity element array portion having the n-type impurity elements and the p-type impurity elements arranged in an alternating manner;

first conductive members disposed on the impurity element array portion and second conductive members disposed below the impurity element array portion, the first and second conductive members electrically connecting the n-type impurity elements and the p-type impurity elements in series;

wherein the power wiring is electrically connected to a portion of the first and second conductive members and adapted to convey electrical power to the impurity element array portion from outside of the power device package; and a first insulating member disposed on at least a portion of the first conductive members, and a second insulating member disposed below at least a portion of the second conductive members.

3. The power device package of claim 2, wherein the impurity element array portion comprises a semiconductor substrate, wherein the n-type impurity elements comprise n-type impurity regions in the semiconductor substrate, the n-type regions having n-type doped or ion-implanted impurities disposed in the semiconductor substrate, and wherein the p-type impurity elements comprise p-type impurity regions in the semiconductor substrate, the p-type regions having p-type doped or ion-implanted impurities disposed in the semiconductor substrate.

4. The power device package of claim 2, wherein the power wiring is electrically connected to the second portion of the lead frame so that it conveys electrical power to the impurity element array portion.

5. The power device package of claim 2, wherein the first and second insulating members of the thermal electric module comprise an oxide or a nitride material.

6. The power device package of claim 1, wherein the wiring pattern comprises aluminum, an aluminum alloy, copper, or a copper alloy, or a combination thereof.

7. The power device package of claim 6, wherein the wiring pattern further comprises nickel, gold, or an alloy thereof.

8. The power device package of claim 1, wherein the conductive adhesive member comprises a solder, a solder paste, or a silver paste, or a combination thereof.

9. The power device package of claim 1, wherein at least one semiconductor chip is disposed so as to be electrically connected to the lead frame in the form of a flip chip or is electrically connected to the lead frame with at least one wire or at least one solder ball, wherein the at least one semiconductor chip is a power semiconductor chip or a control semiconductor chip.

10. The power device package of claim 9, wherein the at least one wire comprises aluminum or gold.

11. The power device package of claim 1, further comprising a heat sink attached to the second surface of the thermal electric module.

12. The power device package of claim 11, wherein the heat sink comprises aluminum, an aluminum alloy, copper, a copper alloy, an aluminum oxide, a beryllium oxide, an aluminum nitride, a silicon nitride, or an epoxy-based resin, or a combination thereof.

13. The power device package of claim 1, wherein the heat sink is attached to the second surface of the thermal electric module using a solder, a metal epoxy, a metal paste, a resin-based epoxy, or an adhesive tape with high heat resistance.

14. The power device package of claim 1, wherein the thermal electric module is configured to be electrically connected to an external circuit that supplies power to the thermal electric module.

15. The power device package of claim 1, wherein the thermal electric module is electrically connected to the first portion of the lead frame.

16. A method of fabricating a power device package, the method comprising:

forming a wiring pattern on a first surface of a thermal electric module, the thermal electric module having a second surface opposite to the first surface, a plurality of n-type impurity elements, and a plurality of p-type impurity elements, the n-type impurity elements and the p-type impurity elements being alternately and electrically connected to each other in series;

mounting one or more power semiconductor chips on the thermal electric module so as to electrically connect to the wiring pattern;

assembling a first portion of a lead frame and the first surface of the thermal electric module together using a conductive adhesive member so that the first portion of the lead frame and the wiring pattern are electrically connected;

electrically connecting one or more control semiconductor chips disposed to a second portion of the lead frame or the wiring pattern, or both, to control the one or more power semiconductor chips, wherein the first and second portions of the lead frame are electrically connected using wiring;

connecting the second portion of the lead frame and the thermal electric module using power wiring;

sealing the thermal electric module, the power semiconductor chips, the control semiconductor chips and a portion of the lead frame with a sealing member so as to expose the second surface of the thermal electric module; and providing a heat sink adjacent the thermal electric module.

17. The method of claim 16, wherein the mounting of the power semiconductor chips on the thermal electric module further comprises mounting one or more control semiconductor chips on the wiring pattern so as to be electrically connected to the wiring pattern.

18. The method of claim 16, wherein assembling the lead frame and the first surface of the thermal electric module together comprises electrically connecting the thermal electric module and the first portion of the lead frame.

19. The method of claim 16, further comprising attaching the heat sink to the second surface of the thermal electric module.

20. The method of claim 16, further comprising electrically connecting the thermal electric module to an external circuit or to the lead frame.

* * * * *

UNITED STATES PATENT AND TRADEMARK OFFICE
CERTIFICATE OF CORRECTION

| | | |
|---|---|---|
| PATENT NO. | : 8,552,541 B2 | Page 1 of 1 |
| APPLICATION NO. | : 13/101078 | |
| DATED | : October 8, 2013 | |
| INVENTOR(S) | : Seungwon Im et al. | |

It is certified that error appears in the above-identified patent and that said Letters Patent is hereby corrected as shown below:

On the Title Page, Item (12) and Item (75), please change inventor Seung-won Lim's name to Seungwon Im.

Signed and Sealed this
Sixth Day of January, 2015

Michelle K. Lee
*Deputy Director of the United States Patent and Trademark Office*